US005731612A

United States Patent [19]
Buxo et al.

[11] Patent Number: 5,731,612
[45] Date of Patent: Mar. 24, 1998

[54] INSULATED GATE FIELD EFFECT TRANSISTOR STRUCTURE HAVING A UNILATERAL SOURCE EXTENSION

[75] Inventors: Juan Buxo, Mesa; Diann Dow, Chandler; Vida Ilderem; Ziye Zhou, both of Phoenix; Thomas E. Zirkle, Tempe, all of Ariz.

[73] Assignee: Motorola, Inc., Schaumburg, Ill.

[21] Appl. No.: 842,097

[22] Filed: Apr. 28, 1997

Related U.S. Application Data

[63] Continuation of Ser. No. 465,020, Jun. 5, 1995, abandoned.

[51] Int. Cl.$^6$ .............................. H01L 29/76; H01L 29/94
[52] U.S. Cl. .......................... 257/345; 257/346; 257/402; 257/409
[58] Field of Search ..................... 257/345, 335, 257/336, 337, 339, 343, 346, 424

[56] References Cited

U.S. PATENT DOCUMENTS

| | | |
|---|---|---|
| 4,599,118 | 7/1986 | Han et al. . |
| 4,729,001 | 3/1988 | Haskell ................. 257/345 |
| 4,859,620 | 8/1989 | Wei et al. . |
| 4,994,904 | 2/1991 | Nakagawa et al. . |
| 5,147,811 | 9/1992 | Sakagami . |
| 5,162,884 | 11/1992 | Liou et al. . |
| 5,166,087 | 11/1992 | Kakimoto et al. . |
| 5,171,700 | 12/1992 | Zamanian . |
| 5,237,193 | 8/1993 | Williams et al. .......... 257/336 |
| 5,270,226 | 12/1993 | Hori et al. . |
| 5,344,787 | 9/1994 | Nagalingam et al. . |
| 5,359,221 | 10/1994 | Miyamoto et al. ........ 257/408 |
| 5,371,394 | 12/1994 | Ma et al. ................... 257/335 |
| 5,386,136 | 1/1995 | Williams et al. .......... 257/409 |
| 5,401,994 | 3/1995 | Adan ........................ 257/335 |
| 5,449,937 | 9/1995 | Arimura et al. ........... 257/345 |
| 5,536,959 | 7/1996 | Kellam ..................... 257/327 |

FOREIGN PATENT DOCUMENTS

| | | |
|---|---|---|
| 54-48489 | 4/1979 | Japan ........................... 257/345 |
| 55-151363 | 11/1980 | Japan ........................... 257/345 |
| 5-283688 | 10/1993 | Japan ........................... 257/345 |

OTHER PUBLICATIONS

IBM Technical Disclosure Bulletin, C.F. Codella and S. Ogura, "Submicron IGFET Device With Double Implanted Lightly Doped Drain/Source Structure", vol. 26, No. 12, May 1984, pp. 6584–6586.

IEEE Electronic Device Letters, Yoshimura et al., "New CMOS Shallow Junction Well FET Structure (CMOS-S-JET) for Low Power–Supply Voltage", Apr. 1992, pp. 35.8.1–35.8.4.

IEEE Electronic Device Letters, Hori et al., "A New p–Channel MOSFET with Large–Tilt Angle Implanted Puchthrough Stopper (LATIPS)", vol. 9, No. 12., Dec. 1988, pp. 641–643.

1985 Symposium on VLSI Technology—Digest of Technical Papers, "A New Half–Micron p–Channel MOS FET with Efficient Punchthrough Stops", May 14–16, 1985, pp. 62–63.

(List continued on next page.)

*Primary Examiner*—Ngân V. Ngô
*Attorney, Agent, or Firm*—Kevin B. Jackson

[57] ABSTRACT

An insulated gate field effect transistor (IGFET) structure (10) includes a source region (14) and a drain region (16) formed in an impurity well (13). A channel region (18) separates the source region (14) from the drain region (16). In one embodiment, a unilateral extension region (17) is formed adjacent the source region (14) only and extends into the channel region (18). The unilateral extension region (17) has a peak dopant concentration at a depth (23) and a lateral distance (24) to provide punchthrough resistance. The IGFET structure (10) is suitable for low (i.e., 0.2–0.3 volts) to medium (0.5–0.6 volts) threshold voltage reduced channel length applications.

12 Claims, 7 Drawing Sheets

OTHER PUBLICATIONS

IEEE Electronic Device Letters, Stinson et al., "Effects of Ion Implantation on Deep-Submicrometer, Drain-Engineered MOSFET Technologies", vol. 38, No. 3, Mar. 1991, pp. 487-497.

IEEE Electronic Device Letters, Hu et al., "Design Tradeoffs Between Surface and Buried-Channel FET's", Mar. 1985, vol. ED-32, No. 3, pp. 584-588.

IEEE Electronic Device Letters, Shibata et al., "An Optimally Designed Process for Submicrometer MOSFET's", Apr. 1982, vol. ED-29, No. 4, pp. 531-535.

INSULATED GATE FIELD EFFECT TRANSISTOR STRUCTURE HAVING A UNILATERAL SOURCE EXTENSION

This application is a continuation of prior application Ser. No. 08/465,020, filed Jun. 5, 1995, now abandoned.

BACKGROUND OF THE INVENTION

The present invention relates, in general, to insulated gate field effect transistors, and more particularly to short channel length insulated gate field effect transistors having low threshold voltages and enhanced punchthrough resistance.

Insulated gate field effect transistor (IGFET) devices are becoming increasingly important in low voltage power applications including personal communication (e.g., pagers, cellular phones, etc.) and portable computers. With lower power consumption being a primary goal with these applications, IGFET devices are being designed to operate at supply voltages less than 3.5 volts. However, semiconductor device parameters such as threshold voltage control, body effect, subthreshold leakage currents, parasitic source/drain capacitances, source/drain to substrate breakdown voltages, and source to drain punchthrough typically limit the performance of low power semiconductor devices.

Source to drain punchthrough generally takes place with the merging of the source and drain depletion regions. When this occurs, the gate region is unable to control carriers in the channel region. The device basically becomes a short circuit and is considered uncontrollable. One prior art approach to overcome this problem is to increase the uniform channel doping to inhibit punchthrough. However, this approach precludes low voltage applications because threshold voltages are subsequently much higher (≧about 0.5 volts).

An alternative approach is to maintain a lower channel doping concentration and place highly doped regions in a bilateral fashion on both the source and drain sides. These regions are often termed punchthrough stops. This approach inhibits punchthrough while maintaining lower threshold voltages (e.g., on the order of 0.3 volts). However, this approach suffers from higher capacitance and reduced drive capability (i.e., reduced transconductance), which in turn results in slower switching speeds.

Accordingly, it would be advantageous to have an IGFET device that possesses a low and controlled threshold voltage, that is punchthrough resistant, and that exhibits good switching characteristics. It would be of further advantage to provide such an IGFET device using conventional techniques to simplify its integration into existing structures.

DETAILED DESCRIPTION OF THE DRAWINGS

Generally, the present invention provides a semiconductor devices such as insulated gate field effect transistors (IGFET) and a method for making the devices. More particularly, the present invention provides an IGFET device having a unilateral doped extension region extending into the channel region from the source region only. In other words, the device is a source-engineered device. The present invention provides an IGFET device that has enhanced resistance to punchthrough, that has a low, stable, and controllable threshold voltage (≧about 0.2 volts), and that exhibits good switching characteristics compared to prior art structures.

One may better understand the present invention by referring to FIGS. 1 to 12 together with the following detailed description. The present invention is described in an n-channel configuration. This is not intended as a limitation and as those skilled in art will appreciate, a p-channel configuration is achieved by converting p-type regions to n-type regions and vice versa. Optionally, the structure according to the present invention is used in a complementary p-channel/n-channel configuration.

Figure 1:
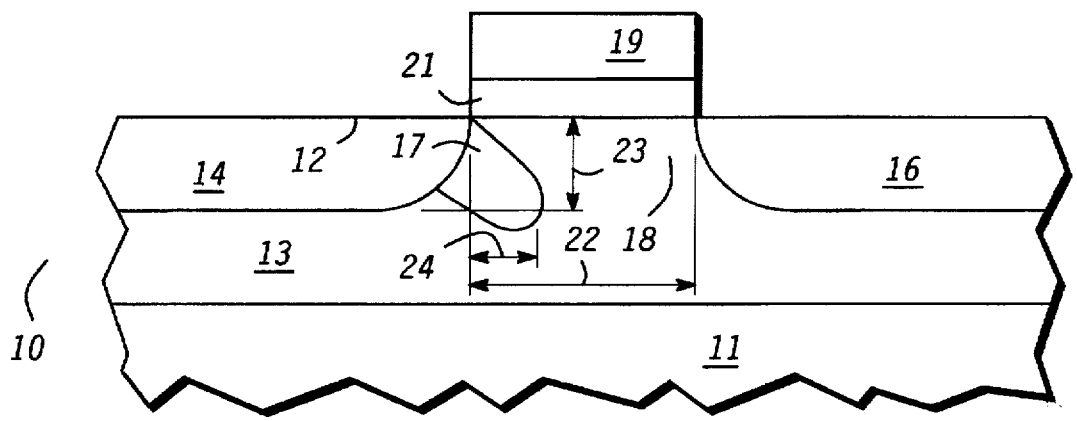
FIG. 1 is an enlarged cross-sectional view of an IGFET structure according to the present invention.

FIG. 1 illustrates an enlarged cross-sectional view of a portion of partially completed IGFET structure 10 according to the present invention. Structure 10 includes a body of semiconductor material or substrate 11 having a major surface 12. An impurity well 13 of p-type conductivity type, commonly referred to as a p-well, extends into substrate 11 from major surface 12. Methods for forming impurity well 13 are well known in the art. By way of example, substrate 11 is an n-type substrate with a resistivity in a range from about 6 ohm-cm to about 8 ohm-cm. Impurity well 13 has a surface dopant concentration typically on the order of $1.0 \times 10^{16}$ atoms/cm$^3$ and extends into substrate 11 to a depth of about 2 to 3 microns depending on the supply voltage value.

Structure 10 further includes a source region 14 and a drain region 16 extending into impurity well 13 from major surface 12. Source and drain regions 14 and 16 typically extend into impurity well 13 to a junction depth of about 0.2 microns to about 0.3 microns and have a surface dopant concentration of about $1.0 \times 10^{20}$ atoms/cm$^3$. Source and drain regions 14 and 16 have an n-type conductivity and are separated or spaced a distance apart to form a channel region 18. Gate dielectric layer 21 separates a gate layer 19 from major surface 12 above channel region 18. Structure 10 typically has a channel length 22 in range from about 10 microns to about 0.25 microns.

A source-side extension region, unilateral doped region, punchthrough stop, or unilateral extension region 17 is adjacent or coupled to the channel side of source region 14. Extension region 17 has a p-type conductivity and a peak dopant concentration at a depth 23 from major surface 12 into channel region 18 and at a lateral distance 24 from the source side of gate layer 19 into channel region 18. Extension region 17 typically has a peak dopant concentration from about $3.0 \times 10^{17}$ atoms/cm$^3$ to about $7.0 \times 10^{17}$ atoms/cm$^3$. Structure 10 is suitable for threshold voltages of about 0.2 volts to about 0.3 volts.

In order to achieve a controlled threshold voltage ($V_t$), higher drive capability, and speed while inhibiting punchthrough, extension region 17 must be appropriately placed or located within channel region 18. That is, the placement of extension region 17 is key in achieving desired device characteristics and performance. FIGS. 2–5 illustrate specific characteristics of structure 10 including a preferred placement of extension region 17 in channel region 18.

Figure 2:
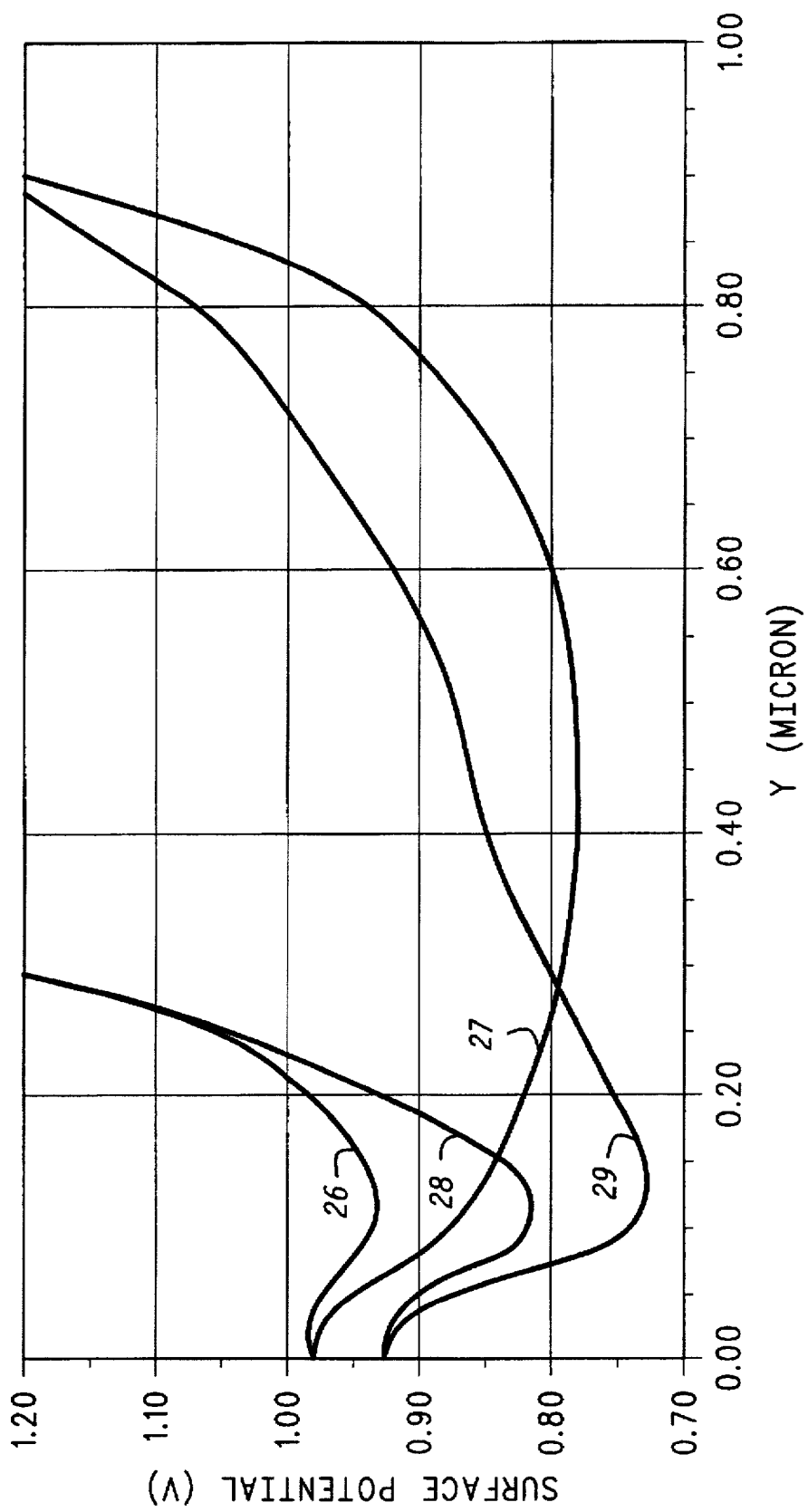
FIG. 2 is a graph of surface potential as a function of distance along the surface from the source region for the structure of FIG. 1 compared to a prior art device.

FIG. 2 illustrates a graph of surface potential in volts (V) as a function of distance Y in microns along major surface 12 from source region 14. It is well known to those skilled in the art that surface potential is one key indicator of the controllability of a device. That is, the controllability decreases exponentially with increases in minimum surface potential. In other words, the lower the surface potential, the more controllable an IGFET device is.

Curves 26 and 27 represent the surface potential for an IGFET device without extension region 17 and for a channel length of 0.4 microns and 2.0 microns respectively. Curves 28 and 29 represent the surface potential for structure 10 shown in FIG. 1 for a channel length 22 of 0.4 microns and 2.0 microns respectively.

The data shown in FIG. 2 is for a gate to source voltage ($V_{GS}$) of about 0.3 V, a drain to source voltage ($V_{DS}$) of about 2.0 V, and a source to bulk voltage ($V_{SB}$) of 0 V. Structure 10 has a peak dopant concentration of about $3.0 \times 10^{17}$ atoms/cm$^3$ at lateral distance 24 of about 0.12 microns, and depth 23 of about 0.08 microns. Also, channel region 18 has a uniform dopant concentration of about $2.0 \times 10^{16}$ atoms/cm$^3$. The standard IGFET device (i.e., a device without an extension region) has a uniform channel concentration of about $4.0 \times 10^{16}$ atoms/cm$^3$. The two structures in FIG. 2 have the same long channel $V_t$. As is readily apparent, extension region 17 significantly lowers the surface potential thereby improving controllability over a standard IGFET device.

Figure 3:
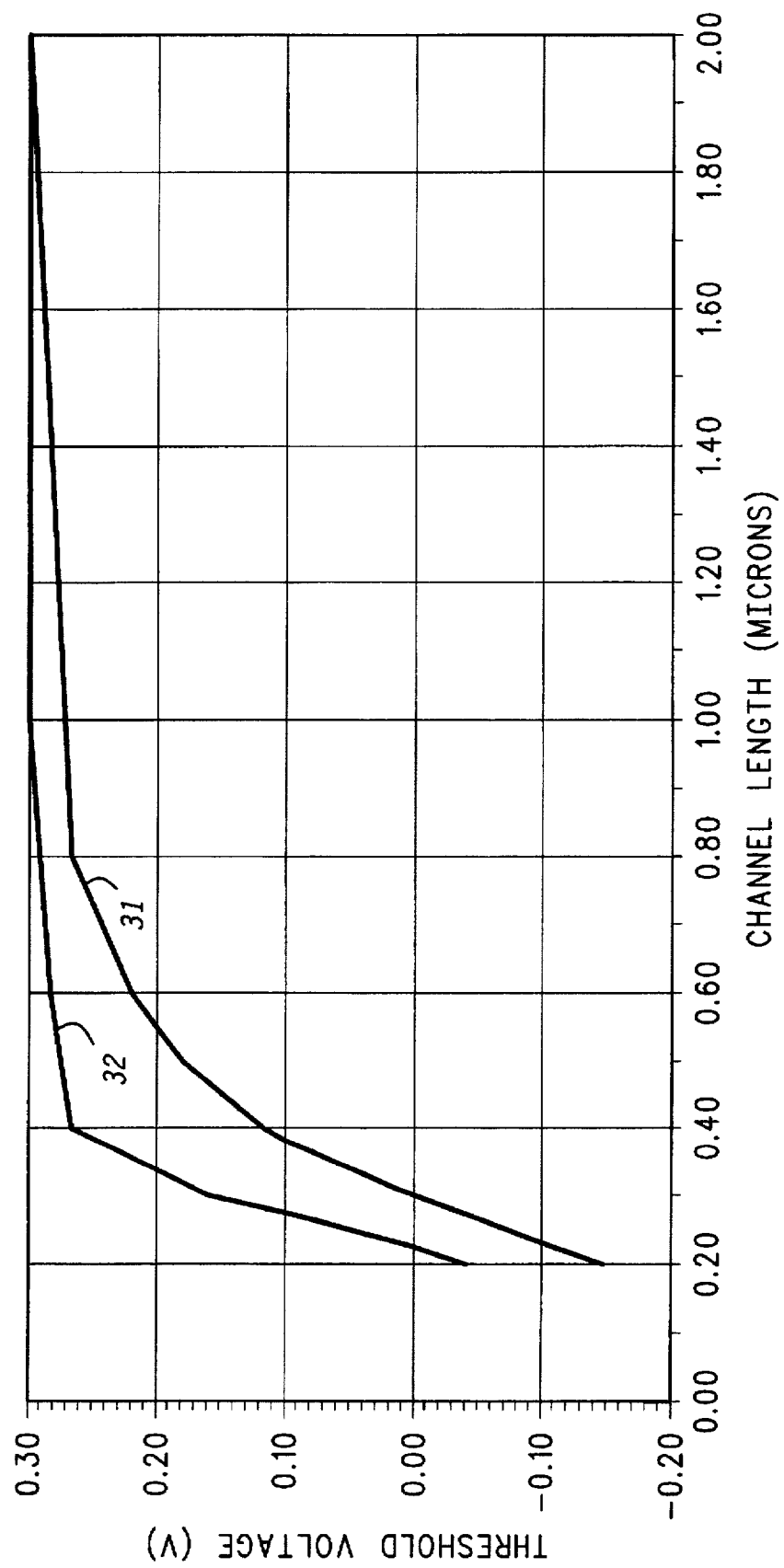
FIG. 3 is a graph of threshold voltage as a function of channel length for the structure of FIG. 1 compared to a prior art device.

Another indicator of IGFET controllability is the change in $V_t$ as the device is scaled down (i.e., as channel length 22 is decreased). FIG. 3 is a graph of $V_t$ in volts as a function of channel length in microns for a $V_{DS}$ of 2.0 volts. The characteristic depicted in FIG. 3 is commonly referred to as $V_t$ roll-off. Curve 31 represents the $V_t$ roll-off for a standard IGFET device (i.e., a device without an extension region). Curve 32 represents the $V_t$ roll-off for structure 10 shown in FIG. 1. Both devices have the same dopant profiles and feature locations as the devices in FIG. 2. As is readily apparent, structure 10 maintains control to much shorter channel lengths than the standard IGFET device.

Figure 4:
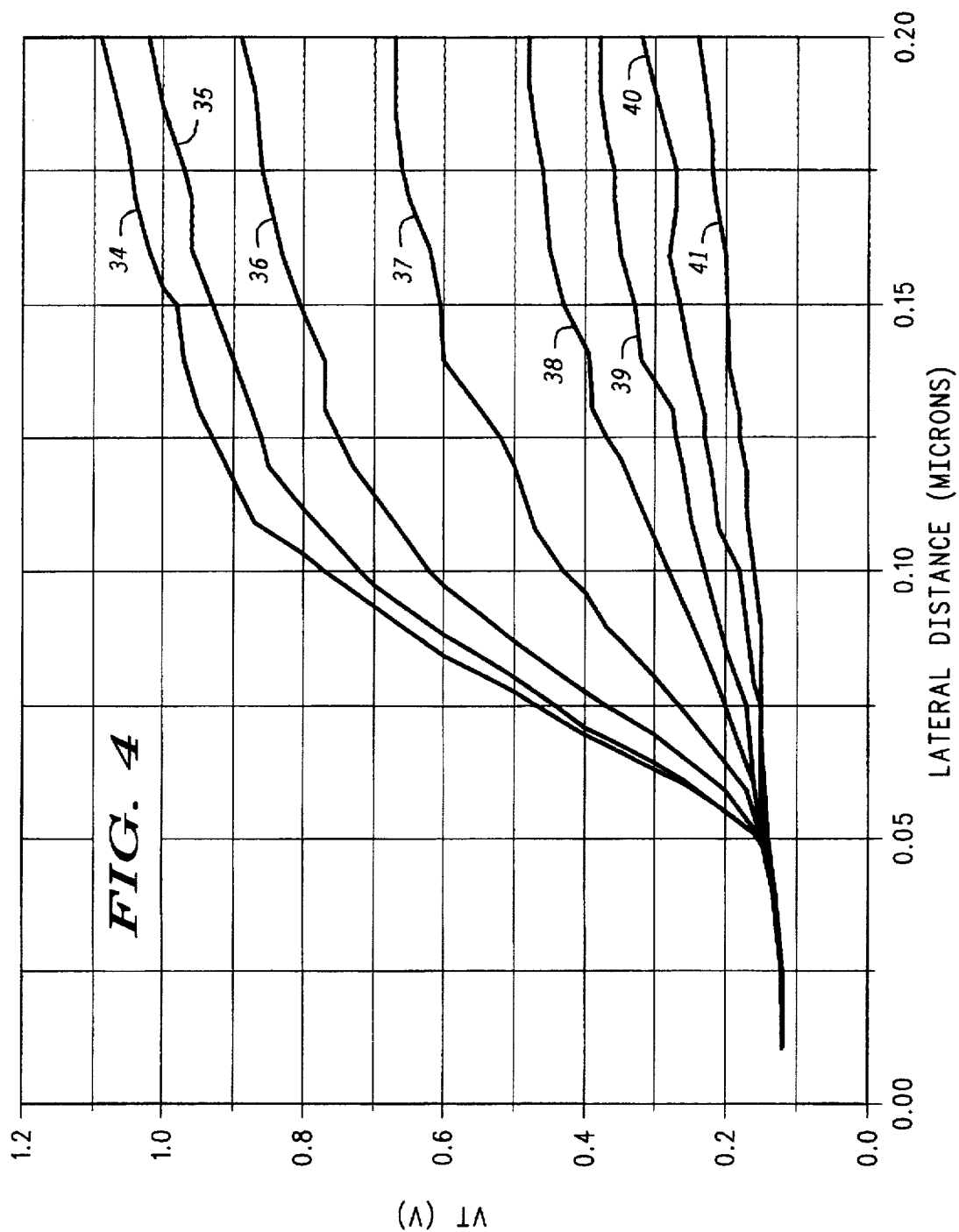
FIG. 4 is a graph of threshold voltage as a function of extension region lateral distance at various extension region depths for the structure of FIG. 1.

FIG. 4 is a graph of $V_t$ as a function of lateral distance 24 of extension region 17 for various peak concentration depths 23. FIG. 4 shows the sensitivity of $V_t$ at a drain bias of 0.1 volts, a channel length 22 of 0.3 microns, and a channel region 18 dopant concentration of about $3.0 \times 10^{16}$ atoms/ cm$^3$. Curves 34–41 correspond to a peak concentration of extension region 17 of about $5.0 \times 10^{17}$ atoms/cm$^3$ at depths of 0.03 microns, 0.05 microns, 0.07 microns, 0.10 microns, 0.13 microns, 0.15 microns, 0.17 microns, and 0.20 microns respectively. As this data indicates, it is preferred that extension region 17 be deep in channel region 18 with a significant lateral distance 24 from source region 14.

Figure 5:
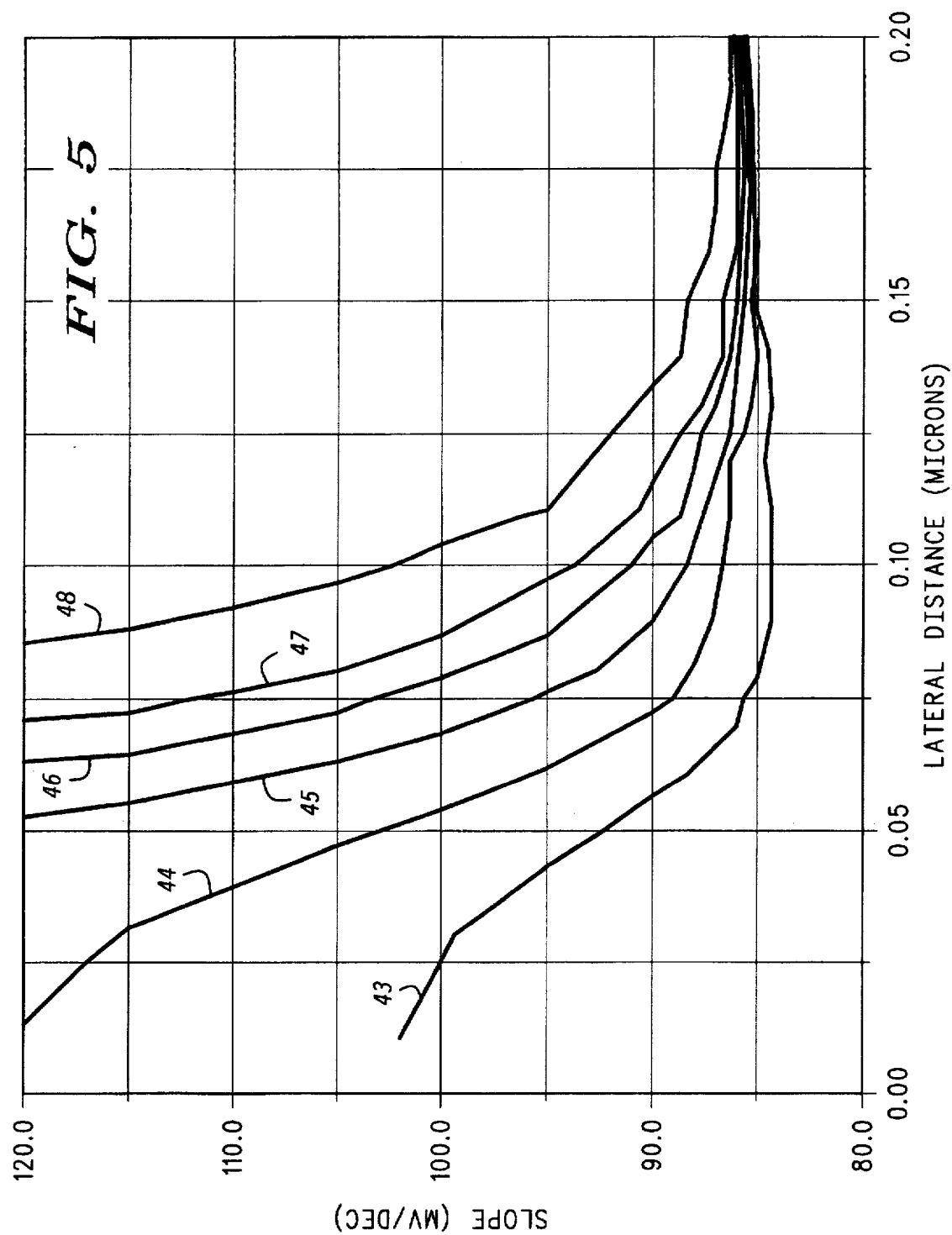
FIG. 5 is a graph of subthreshold slope as a function of extension region lateral distance at various drain biases for the structure of FIG. 1.

FIG. 5 is a graph showing the subthreshold slope in millivolts per decade as a function of lateral distance 24 of extension region 17 for various drain biases ($V_d$, in volts). This data corresponds to structure 10 having extension region 17 with a peak concentration of about $5.0 \times 10^{17}$ atoms/cm$^3$ at a constant preferred depth 23 of 0.15 microns, a channel length 22 of 0.3 microns, and a channel region 18 dopant concentration of about $3.0 \times 10^{16}$ atoms/cm$^3$. Curves 43–48 correspond to drain biases (i.e., $V_d$) of 0.1 volts, 0.5 volts, 1.0 volts, 1.5 volts, 2.0 volts, and 3.0 volts respectively.

As those skilled in the art are aware, subthreshold slope also indicates the controllability of a device. That is, subthreshold slope indicates how effectively an IGFET device can be turned off as $V_{GS}$ is decreased below $V_t$. It is key to maintain a low subthreshold slope with an applied drain bias. A high subthreshold slope indicates that a large current will flow even when the IGFET device is turned off by the gate. The data shown in FIG. 5 indicates that it is preferred that extension region 17 extend into channel region 18 a lateral distance 24 in a range from about 0.15 microns to about 0.20 microns to ensure sufficient control for an applied drain bias conditions less than 3.0 volts. For lateral distances greater than about 0.20 microns, other performance criteria (e.g., drive current) are detrimentally impacted.

Structure 10 has several advantages over prior art structures. For example, structure 10 has an improved punchthrough resistance compared to a structure without extension or punchthrough stop regions. Also, structure 10 has a comparable punchthrough resistance to a structure having extension regions in a bilateral fashion. However, structure 10 has a much higher drive capability compared to the bilateral structure. In addition, structure 10 has a much lower drain capacitance than a bilateral structure because a high doped extension region is not adjacent the drain region.

The higher drive capability and lower capacitance provide structure 10 with higher switching speeds compared to the bilateral structure. Furthermore, structure 10 provides lower threshold voltage capability compared to devices having increased channel doping, and therefore has a larger transconductance and $I_{dsat}$ for the same gate voltage applied.

Figure 6:
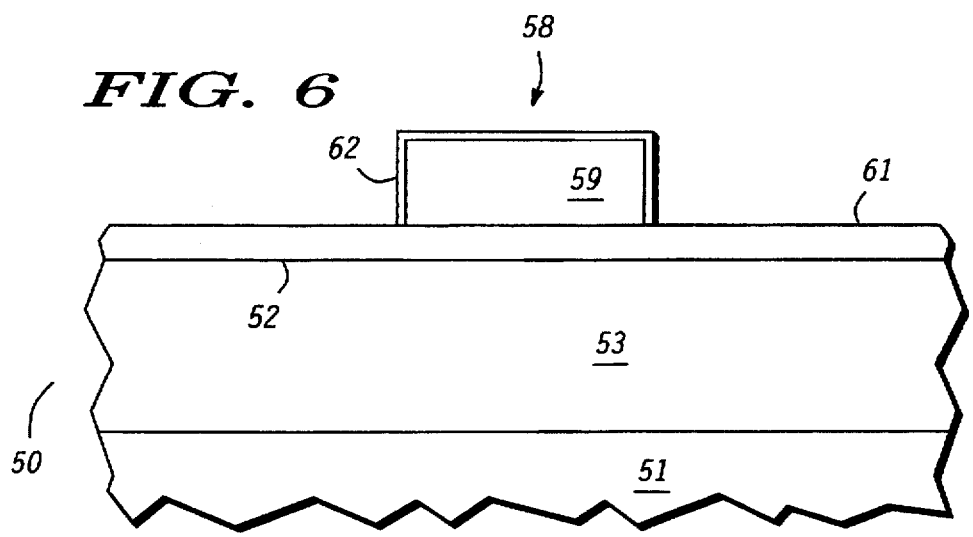
FIGS. 6–10 are enlarged cross-sectional views of an IGFET structure according to the present invention at various stages of fabrication.

FIGS. 6 to 10 show a preferred method for making an IGFET device or structure 50 according to the present invention. FIG. 6 illustrates an enlarged cross-sectional view of a portion of IGFET structure 50 early in fabrication according to the present invention. Structure 50 includes a body of semiconductor material or substrate 51 having a major surface 52. An impurity well 53 of p-type conductivity type extends into semiconductor substrate from major surface 52. Methods for forming impurity well 53 are well known in the art. The dopant concentration and resistivity ranges for impurity well 53 and substrate 51 are similar to those of impurity well 13 and substrate 11 described above.

A gate dielectric layer 61 is formed on major surface 52. Preferably, gate dielectric layer 61 comprises a silicon oxide with a thickness in range from approximately 50 angstroms to approximately 150 angstroms. A gate layer 59 is formed on a portion of gate dielectric layer 61. Gate layer 59 typically comprises a polycrystalline semiconductor layer such as a polysilicon layer. Gate layer 59 together with that portion of gate dielectric layer 61 between major surface 52 and gate electrode 59 form a gate structure 58. By way of example, gate layer 59 has a thickness of about 3,000 angstroms. Gate dielectric layer 61 and gate layer 59 are formed using well known processing techniques. Preferably, an oxide layer 62 is formed on gate layer 59. As those skilled in the art are aware, oxide layer 62 serves to regrow those portions of gate dielectric layer 61 that have been undercut during processing.

Figure 7:
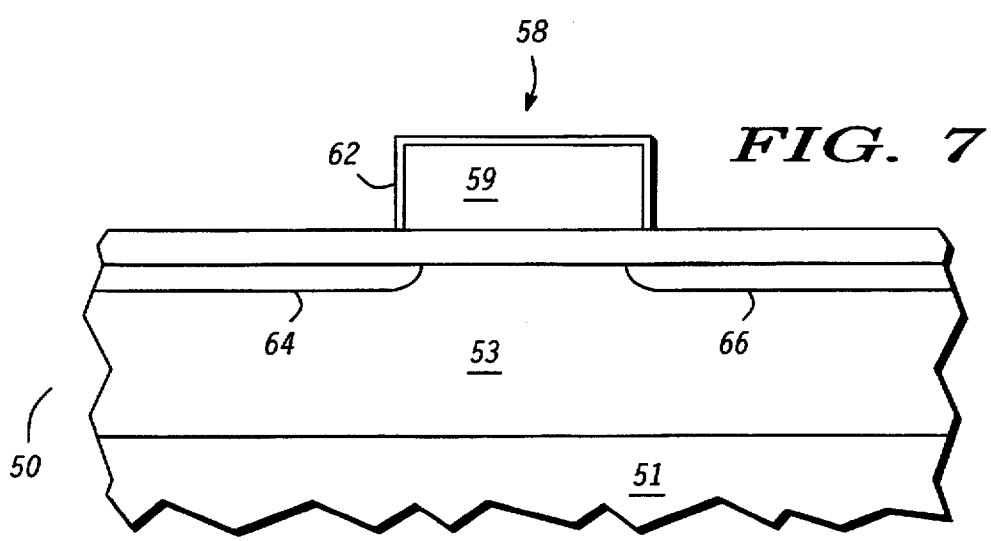

FIG. 7 illustrates structure 50 at a subsequent step in fabrication. In particular, FIG. 7 shows the incorporation of n-type dopant into impurity well 53 to provide n-type regions 64 and 66. For example, n-type regions 64 and 66 are formed by ion implanting an n-type dopant such as arsenic into major surface 52 preferably at an angle of zero degrees (i.e., substrate 51 is perpendicular to the ion beam). An arsenic dose of about $3.0 \times 10^{15}$ atoms/cm$^2$ and an implant energy of about 90 keV is suitable to provide n-type regions 64 and 66. Simultaneously with the formation of n-type regions 64 and 66, gate layer 59 is doped with n-type dopant (e.g., is doped with arsenic).

Figure 8:
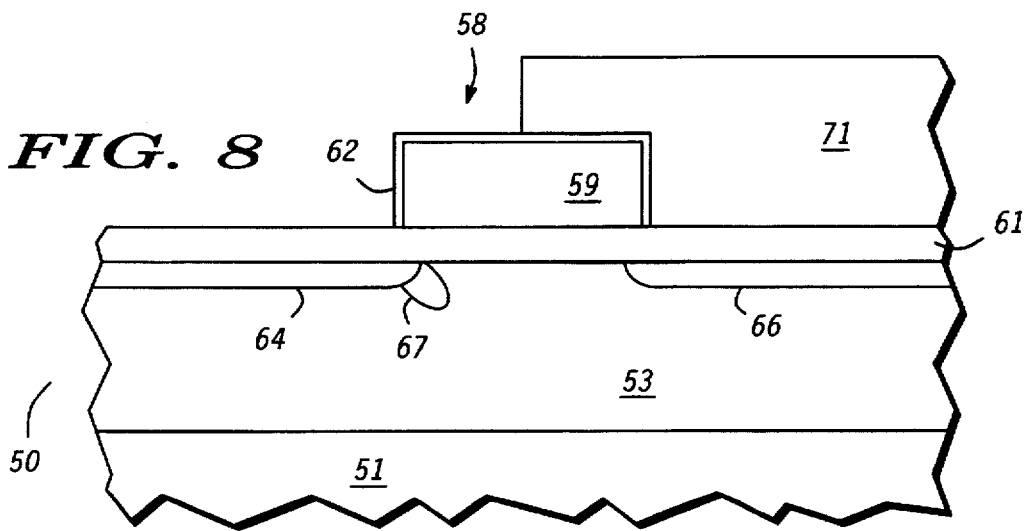

FIG. 8 illustrates structure 50 at a later step in fabrication. In particular, FIG. 8 shows structure 50 with a masking layer 71 formed over n-type region 66 and a portion of gate structure 58 adjacent n-type region 66. Masking layer 71 comprises for example, a thick (e.g., 1.0 micron) photoresist layer, a dielectric layer, or the like. After masking layer 71 is formed, p-type region 67 is formed adjacent n-type region 64. P-type region 67 is formed, for example, using an angled p-type ion implant. For example, substrate 51 is placed into an ion implant apparatus such that substrate 51 is between about 10 degrees to about 60 degrees with respect to an ion beam source. Such techniques are well known in the art. An implant dose of about $1.0 \times 10^{13}$ to about $1.0 \times 10^{14}$ atoms/cm$^2$ and an implant energy less than about 50 keV is suitable. A B$^{11}$ boron source is suitable. Optionally, the process steps depicted in FIGS. 7 and 8 may occur in reverse order to that shown. That is, p-type region 67 is formed first, followed by the formation of n-type regions 64 and 66.

Figure 9:
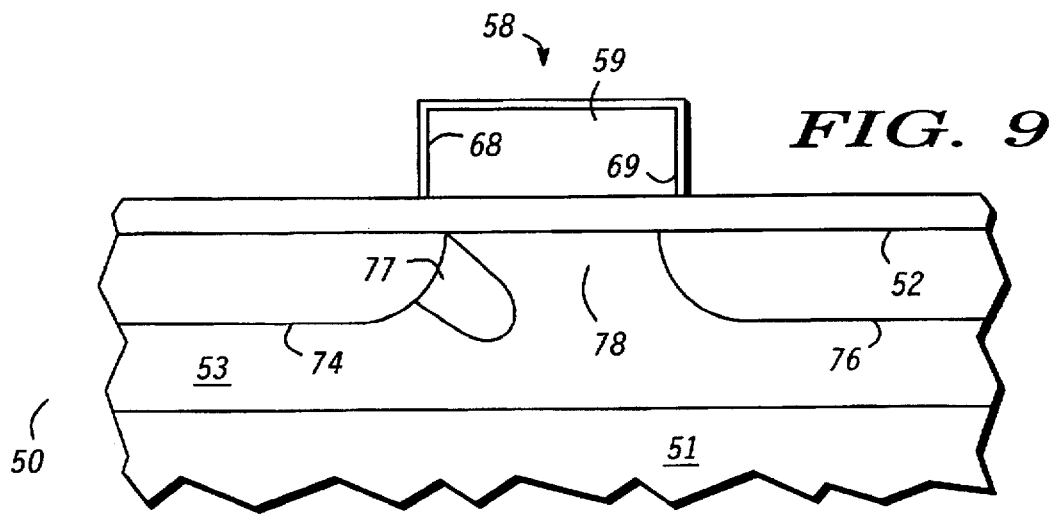

FIG. 9 illustrates structure 50 at a later step in fabrication. In particular, FIG. 9 shows structure 50 after substrate 51 is exposed to an elevated temperature to form source region 74 adjacent a first edge 68 of gate structure 58, drain region 76 adjacent a second edge 69 of gate structure 58, and unilateral extension region 77 coupled or adjacent to source region 74. For example, substrate 51 is exposed to about 1020° C. to about 1050° C. for about 30 seconds to about 60 seconds in a rapid thermal anneal (RTA) system. Alternatively, an equivalent furnace anneal is used. That portion of impurity well 53 between source region 74 and drain region 76 forms a channel region 78. By way of example, source region 74 and drain region 76 extend between approximately 0.2 microns and approximately 0.3 microns into impurity well 53 from major surface 52.

The placement of the peak concentration of extension region 77 is achieved by adjusting implant energy, gate oxide thickness, implant angle, or anneal conditions, or combinations thereof. These techniques are well known in the art. Preferably, extension region 77 has a peak concentration of about $3.0 \times 10^{17}$ atoms/cm$^3$ to about $7.0 \times 10^{17}$ atoms/cm$^3$. Preferably, the peak concentration is about 0.15 microns from major surface 52 and at a lateral distance in range from about 0.15 microns to about 0.20 microns from edge 68 of gate structure 58.

Figure 10:
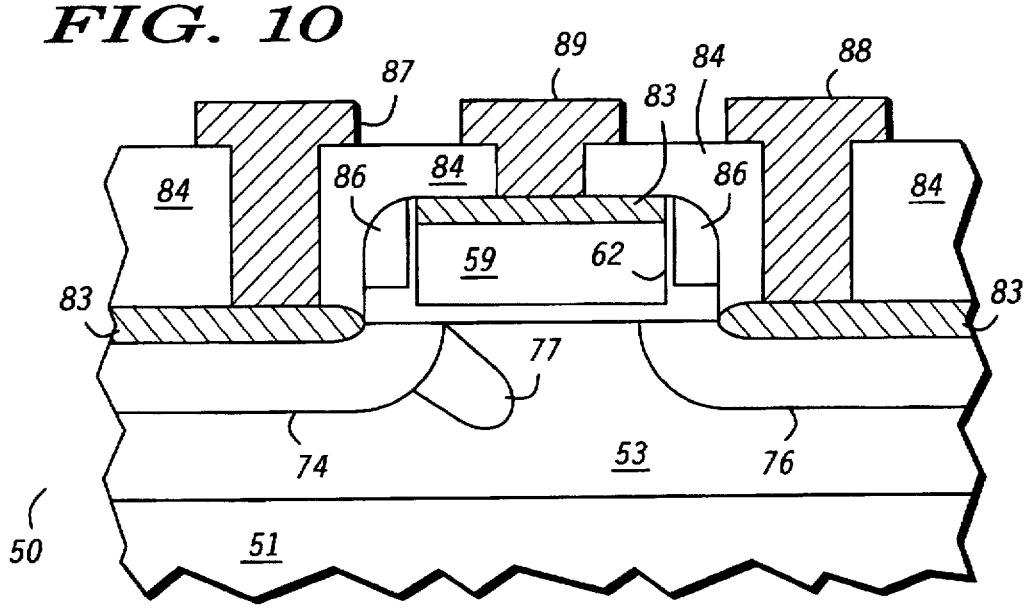

FIG. 10 illustrates structure 50 towards the end of fabrication. Using techniques well known in the art, dielectric spacers 86 are formed along oxide layer 62 lining the sidewalls of gate layer 59. Spacers 86 comprise, for example, silicon nitride or the like. Electrodes are formed that provide contact to source region 74, drain region 76 and gate layer 59. For example, a silicide 83 is formed in source region 74, drain region 76, and gate layer 59 using well known techniques.

An insulating layer 84 is formed on structure 50, i.e., on source region 74, drain region 76 and gate layer 59. A plurality of openings (not shown) are then formed in insulating layer 84 to expose portions of silicide 83 in source region 74, drain region 76, and gate layer 59. Source and drain electrodes 87 and 88 are formed using well known techniques to contact silicide 83 in source region 74 and drain region 76 respectively. Gate electrode 89 is formed to contact silicide 83 on gate layer 59 using well known techniques.

Figure 11:
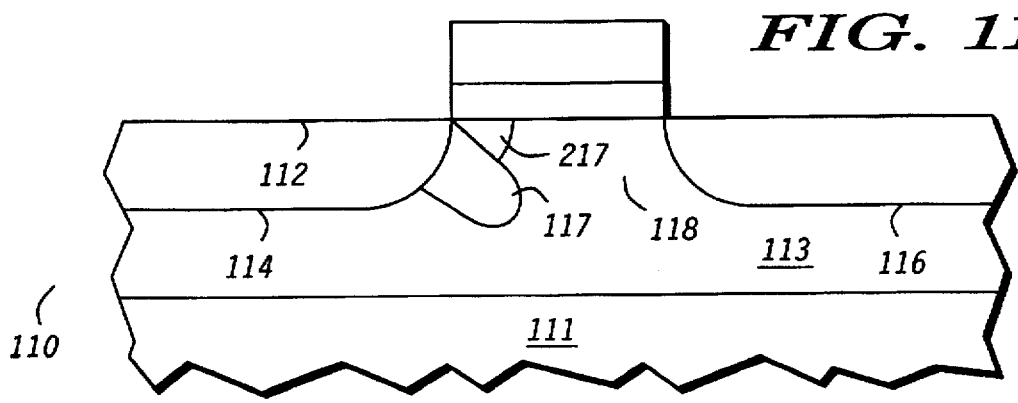
FIG. 11 is an enlarged cross-sectional view of another embodiment of an IGFET structure according to the present invention.

FIG. 11 illustrates an enlarged cross-sectional view of a higher threshold voltage embodiment of a source-engineered IGFET structure according to the present invention. Structure 110 is suitable for threshold voltages of about 0.5 volts to about 0.6 volts.

Like structure 10, structure 110 includes a substrate 111 and a p-type impurity well 113 extending from a major surface 112 of substrate 111. An n-type source region 114 and an n-type drain region 116 extend into impurity well 113 from major surface 112. A channel region 118 separates source region 114 from drain region 116.

A unilateral extension region or punchthrough stop region 117 of a p-type conductivity is adjacent to source region 114. Unilateral extension region 117 has the same characteristics (e.g., dopant concentration, depth, and lateral distance) as extension region 17. To provide the higher threshold voltage, a unilateral threshold voltage adjustment region 217 is placed adjacent source region 114 and between extension region 117 and major surface 112. Unilateral threshold voltage adjustment region 217 has the same conductivity type as extension region 117, has a lower peak concentration than extension region 117 (e.g., about $1.0 \times 10^{17}$ atoms/cm$^3$), and extends into channel region 118 to a lateral distance that is about 50% less than extension region 117.

Unilateral threshold voltage adjustment region 217 is conveniently formed using a zero degree ion implant and is implanted either before or after extension region 117 (as shown in FIG. 8). Preferably, the implant is then annealed at the same time as source region 114, extension region 117, and drain region 116 (i.e., about 1020° C. to about 1050° C. for about 30 seconds to about 60 seconds).

Figure 12:
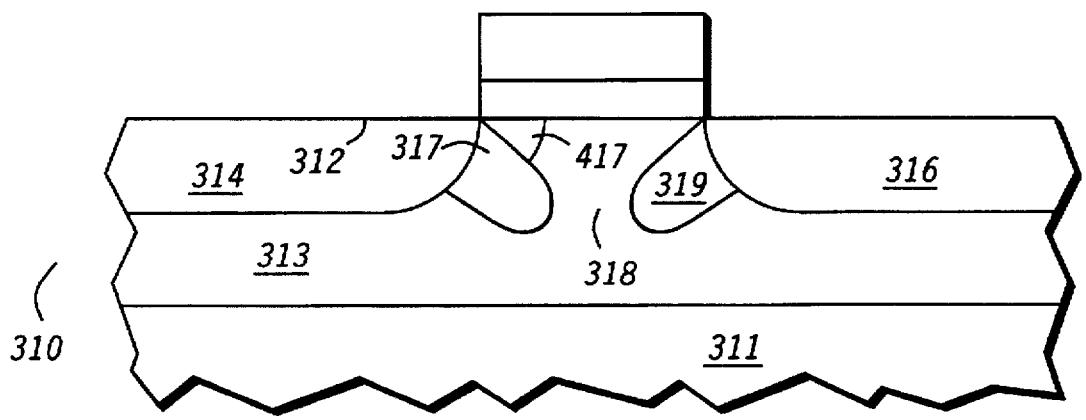
FIG. 12 is an enlarged cross-sectional view of yet another embodiment of an IGFET structure according to the present invention.

FIG. 12 illustrates an enlarged cross-sectional view of another embodiment of an IGFET structure according to the present invention. Structure 310 includes a substrate 311 and a p-type impurity well 313 extending from a major surface 312 of substrate 311. An n-type source region 314 and an n-type drain region 316 extend into impurity well 313 from major surface 312. A channel region 318 separates source region 314 from drain region 316.

Structure 310 further includes a first extension region or punchthrough stop region 317 extending from source region 314 into channel region 318. First extension region 317 has the same characteristics (e.g., dopant concentration, depth, and lateral distance) as extension region 17. A unilateral threshold voltage adjustment region 417 is placed adjacent to source region 314 and between first extension region 317 and major surface 312. A second extension region or punchthrough stop region 319 extends from drain region 316 into channel region 318. Second extension region 319 has the same characteristics (e.g., dopant concentration, depth, and lateral distance) as first extension region 317. Unilateral threshold voltage adjustment region 417 has the same characteristics as unilateral threshold voltage adjustment region 217.

Second extension region 319 is formed, for example, at the same time as first extension region 317 using angled implantation without a masking layer over drain region 316. The same techniques used to form extension region 77 are suitable. A masking layer is then placed over drain region 316 and a portion of the gate structure followed by the formation of unilateral threshold voltage adjustment region 417. The same techniques used to form unilateral threshold voltage adjustment region 217 are used to form unilateral threshold voltage adjustment region 417. Optionally, unilateral threshold voltage adjustment region 417 is formed first, followed by the formation of first and second extension regions 317 and 319.

Structure 310 is a bilateral punchthrough stop device with a unilateral threshold voltage adjustment region that has bi-directional capability. Although the current carrying capability is not symmetrical due to unilateral threshold voltage adjustment region 417 being on one side only, structure 310 is more reliable than a unilateral device in those applications requiring the device to run in both directions.

By now it should be appreciated that IGFET structures and methods for forming them have been provided. In one embodiment, a source-side or unilateral punchthrough stop region extends into the channel region from the source side only to provide enhanced punchthrough resistance. This embodiment provides improved switching characteristics compared to prior art devices having bilateral punchthrough stop regions. In another embodiment, a unilateral threshold voltage adjustment region is incorporated to provide enhanced punchthrough resistance in both unilateral or bilateral configurations at higher threshold voltages. The IGFET devices provided herein utilize existing processing techniques thereby simplifying their integration into existing products.

We claim:

1. An insulated gate field effect transistor structure comprising:
   a body of semiconductor material having a first conductivity type and a first major surface;
   a source region having a second conductivity type formed in the body of semiconductor material extending from the first major surface;
   a drain region having the second conductivity type formed in the body of semiconductor material extending from the first major surface, wherein a portion of the body of semiconductor material separates the source region from the drain region to provide a channel region;
   a gate structure formed on the body of semiconductor material above the channel region, the gate structure having first edge contiguous with the source region and a second edge contiguous with the drain region;
   a unilateral extension region formed in the body of semiconductor material, the unilateral extension region adjacent the source region, wherein the unilateral extension region has the first conductivity type and extends into the channel region, and wherein the drain region is formed absent an extension region of the first conductivity type, and wherein the unilateral extension region has a peak dopant concentration at a first depth from the first major surface in a range from about 0.15 microns to about 0.20 microns;
   a first electrode coupled to the source region;
   a second electrode coupled to the drain region; and
   a third electrode coupled to the gate structure.

2. The structure of claim 1 wherein the peak dopant concentration is at a first lateral distance from the first edge.

3. The structure of claim 2 wherein the first lateral distance is in a range from about 0.15 microns to about 0.20 microns.

4. The structure of claim 1 wherein the gate structure includes a polycrystalline semiconductor layer formed on a gate dielectric layer, the polycrystalline semiconductor layer having the second conductivity type.

5. The structure of claim 1 further comprising a unilateral threshold voltage adjustment region adjacent the source region and between the unilateral extension region and the first major surface, the unilateral threshold voltage adjustment region having the first conductivity type.

6. An IGFET device comprising:
   a semiconductor substrate having a major surface;
   an impurity well of a first conductivity type extending from the major surface into the semiconductor substrate;
   a source region having a second conductivity type formed in the impurity well;
   a drain region having the second conductivity type formed in the impurity well and spaced a distance from the source region to provide a channel region;
   a gate dielectric layer formed on the major surface above the channel region;
   a gate layer formed on the gate dielectric layer, the gate layer have an edge adjacent the source region; and
   a source side extension region of the first conductivity type contiguous with the source region and extending into the channel region, the source side extension region having a peak dopant concentration at a first depth from the major surface in range from about 0.15 microns to about 0.20 microns and at a lateral distance from the edge in range from about 0.15 microns to about 0.20 microns, wherein the IGFET device is formed absent an extension region of the first conductivity type contiguous with the drain region.

7. The device of claim 6 wherein the depth is about 0.15 microns.

8. The device of claim 6 wherein the peak dopant concentration is about $3.0 \times 10^{17}$ atoms/cm$^3$ to about $7.0 \times 10^{17}$ atoms/cm$^3$.

9. A unilateral IGFET structure comprising a source region and a drain region/formed in a body of semiconductor material, the source region separate from the drain region to provide a channel region between the source and drain regions, wherein the source and drain regions extend from a major surface of the body of semiconductor material and have a first conductivity type, a gate structure formed on the body of semiconductor material above the channel region, and a source-side extension region of a second conductivity type formed in the body of semiconductor material extending from the source region into the channel region, wherein the source-side extension region has a peak dopant concentration at a depth in a range from about 0.15 microns to about 0.20 microns from the major surface, and wherein the unilateral IGFET structure is absent a drain-side extension region of the second conductivity type.

10. The structure of claim 9 wherein the gate structure has a first edge above the source region, and wherein the peak dopant concentration is located a lateral distance from the first edge into the channel region.

11. The structure of claim 10 wherein the lateral distance is in a range from about 0.15 microns to about 0.20 microns.

12. An IGFET structure having a unilateral threshold voltage adjustment region comprising:
   a source region and a drain region formed in a body of semiconductor material, the source region separate from the drain region to provide a channel region between the source and drain regions, wherein the source and drain regions extend from a major surface of the body of semiconductor material and have a first conductivity type;
   a gate structure formed on the body of semiconductor material above the channel region;

a first punchthrough stop region of a second conductivity type formed in the body of semiconductor material extending from the source region into the channel region, wherein the first punchthrough stop region has a peak dopant concentration at a depth from the major surface;

a unilateral threshold voltage adjustment region adjacent to the source region and between the first punchthrough stop region and the major surface, the unilateral threshold voltage adjustment region having the second conductivity type, wherein the drain region is formed absent a threshold voltage adjustment region; and a second punchthrough stop region of the second conductivity type formed in the body of semiconductor material extending from the drain region into the channel region.

* * * * *